United States Patent [19]
Gumm et al.

[11] Patent Number: 5,493,209
[45] Date of Patent: Feb. 20, 1996

[54] TUNABLE TRIGGER ACQUISITION SYSTEM AND METHOD FOR MAKING IN-SERVICE TIME-DOMAIN SIGNAL MEASUREMENTS

[75] Inventors: Linley F. Gumm, Beaverton; Dana E. Whitlow, Aloha, both of Oreg.

[73] Assignee: Tektronix, Inc., Wilsonville, Oreg.

[21] Appl. No.: 140,343

[22] Filed: Oct. 20, 1993

[51] Int. Cl.⁶ .......................... H04N 17/00; H04N 7/10; H04N 7/04
[52] U.S. Cl. ..................... 324/76.23; 324/76.27; 348/180
[58] Field of Search ................... 348/476, 478, 348/479, 193, 180; 324/76.23, 76.27

[56] References Cited

U.S. PATENT DOCUMENTS

| | | | |
|---|---|---|---|
| 3,949,312 | 4/1976 | Markowitz | 324/76.27 |
| 4,721,997 | 1/1988 | Wittrock | 348/193 |
| 5,073,822 | 12/1991 | Gumm | 348/193 |
| 5,210,483 | 5/1993 | Amamoto | 324/76.27 |
| 5,233,418 | 8/1993 | Gumm | 348/476 |

*Primary Examiner*—Kenneth A. Wieder
*Assistant Examiner*—Jose M. Solis
*Attorney, Agent, or Firm*—William K. Bucher; Richard B. Preiss

[57] ABSTRACT

A spectrum analyzer (50) has a tunable trigger acquisition system (52) that includes a selectable trigger acquisition bandwidth. Sufficiently wide signal acquisition bandwidth is obtained by tapping into a high-frequency IF amplifier (54) signal and down-converting it to a moderate IF frequency for trigger extraction. A down-conversion local oscillator (62) is phase-lock-loop (64) tunable over a range of the high IF frequencies to allow extracting a time and frequency selectable trigger from the desired carrier signal frequency even if the spectrum analyzer is substantially offset in frequency from the desired carrier. The moderate frequency IF amplifier (66) includes a switchable bandpass filter (68) that provides adequate selectivity to detect triggers from a variety of signal types while rejecting unwanted signals such as adjacent channel CATV carriers that are often detectable when the measurement frequency is offset toward the channel edges.

13 Claims, 5 Drawing Sheets

TUNABLE TRIGGER ACQUISITION SYSTEM AND METHOD FOR MAKING IN-SERVICE TIME-DOMAIN SIGNAL MEASUREMENTS

TECHNICAL FIELD

This invention relates to cable television ("CATV") measurements and more particularly to measurements carried out on selectable frequency and time intervals of a channel being measured such that there is no disruption to a viewer of the channel being measured.

BACKGROUND OF THE INVENTION

CATV systems typically include a "headend" for acquiring and preparing television signals for routing to customers or other viewers and a distribution system for carrying the prepared signals to the customers' receivers. The television signals are sent in a frequency-domain multiplexed format over a coaxial cable, i.e., each signal is converted to a unique frequency for transmission. To receive a given signal on the cable, the customer tunes the receiver to the desired signal channel in the same manner as for a broadcast signal.

Tuning to a channel entails receiving a number of signals confined within the channel while excluding signals confined within adjacent channels. FIG. 1 shows a typical distribution of signals confined within representative adjacent channels of the television frequency spectrum. Each of the channels, in this case channels two, three, and four, includes a picture carrier P, a chroma carrier C, and a sound carrier S. Each carrier may further include sideband SB energy resulting from modulation of the carrier. An alphanumeric prefix to a sideband SB identifier associates the sideband with a particular carrier, and a numeric subscript associates the carrier or sideband with a channel number. For example, $PSB_3$ is the numeric designation for the channel 3 picture carrier sidebands. Carriers $C_2$ and $S_2$ are unmodulated and therefore have no sidebands. Carrier $P_2$ is modulated by sync pulses only and, therefore, shows sidebands $PSB_2$ having a cusped distribution characteristic of pulsed modulation. Carrier $P_3$ is modulated by sync pulses and video, and therefore, shows sidebands $PSB_3$ having an irregular distribution characteristic of video modulation.

At any instant in time, the signal energy distribution in a particular channel may appear like that shown for channel two, three, or four depending on the modulation present at a particular instant in time. The signal energy distribution shown for channel two represents the minimal modulation present during a vertical retrace interval, whereas the signal energy distribution shown for channel three represents the typical modulation present during an active horizontal line. The signal energy distribution shown for channel four represents the modulation present during a vertical retrace interval in which a multiburst color test signal is present. Therefore, sidebands $PSB_4$ have a cusped distribution characteristic of such a test signal. Of course, many other energy distribution patterns are possible.

The distribution system requires that the CATV signals, such as those illustrated in FIG. 1, be amplified at regular distances along the cable to restore signal strength lost because of cable attenuation. CATV amplifiers typically have low distortion and noise, but even high-quality amplifiers add distortion and noise to the amplified signal.

Distortion generates additional signals referred to in the CATV industry as intermodulation products or "beats." Among the most troublesome are "triple beats" caused by mixing together three different signals. Picture carriers P are the strongest signals carried on the cable. Because most of the picture carrier frequencies are spaced apart by six megahertz, most triple beat products fall very close to the picture carrier frequencies. In a CATV band spanning 500 MHz, over 1000 beats can occur near each picture carrier frequency. With so many beats, no attempt is made to measure them individually, but rather the composite total of all the beats is measured.

To increase signal-to-noise ratio, the signal amplitude on the cable should be maximized. However, large signal amplitudes cause the triple beat amplitudes to increase sharply, causing a "muddy" television picture. To minimize the effects of triple beats, the amplitude of the signals should, therefore, be minimized. However, minimizing the amplitude of the signals drops their amplitude with respect to the noise causing a "snowy" television picture.

Therefore, optimum performance in a CATV distribution system requires carefully adjusting the signal amplitude to balance the effects of distortion and noise.

Prior methods for measuring noise and/or distortion required interrupting service on the CATV channel being measured. Because customers complained about such loss of service, "in-service" techniques were developed so that measurements could be made without interrupting service.

For example, and with reference to FIG. 2, U.S. Pat. No. 5,073,822 issued Dec. 17, 1991 for IN-SERVICE CABLE TELEVISION MEASUREMENTS, which is assigned to the assignee of this application, describes a spectrum analyzer 10 equipped to make "gated spectrum measurements" that allow energy to be sampled from a channel at predetermined time intervals such as during a vertical interval or an active line time. Gated spectrum measurements are particularly useful for making measurements during time intervals when no modulation is present.

Spectrum analyzer 10 receives an RF input signal that is attenuated, filtered, and mixed with a swept local oscillator 12 that up-converts the frequency of the input signal to a first intermediate frequency. The first intermediate frequency is then down-converted by a second fixed frequency local oscillator 14 to produce a second intermediate frequency. The second intermediate frequency is mixed with a system clock signal CLK to produce a final intermediate frequency signal for processing and display.

The final intermediate frequency signal is conditioned by a variable bandwidth IF amplifier 16 and a logarithmic amplifier 18 for distribution to a video amplifier 20 and a trigger circuit 22. The output signal from video amplifier 20 is either stored in a digital storage device 24 or sent to a deflection amplifier 26 for display on a cathode-ray tube (CRT) 28 or other suitable display device. The output signal from trigger circuit 22 is sent to a sweep circuit 32 for triggering sweep signals that coordinate the first local oscillator tuning frequency with the video signal display. The displayed signal originates either directly from video amplifier 20 or indirectly from digital storage device 24.

Making noise measurements entails tuning spectrum analyzer 10 to an unswept frequency above the picture carrier frequency. However, such tuning prevents a sync separator circuit in trigger circuit 22 from operating normally. Therefore, a separate trigger extraction circuit 33 is added to the otherwise conventional circuit. Trigger extraction circuit 33 includes an IF amplifier 36 coupled to the output of a mixer 38, a video detector 40 coupled to the output of IF amplifier 36, and a video amplifier 42 coupled to the output of video detector 40. The output signal polarity of video amplifier 42 is selected by a polarity switch 44 and is coupled to deflection amplifier 26 and via a trigger selector switch 46 to a sync separator (not shown) in trigger circuit 22. This arrangement provides selectable time interval triggering of the display sweep signals during, for example, the unmodulated vertical interval time of the channel being measured.

A transmission gate 48 situated in the IF signal path passes signal energy only during the predetermined measurement time periods, such as the vertical interval or an active line time. Transmission gate 48 is controlled by a gate control circuit 49 that is coupled to the output of trigger circuit 22. With this circuit arrangement, spectrum analyzer 10 can provide in-service cable television measurements of carrier-to-noise ratio and composite triple beat ratio. The carrier-to-noise ratio is determined by averaging signal data sampled at a fixed time interval of each unmodulated horizontal line time, and the triple beat ratio is determined from signal data sampled during the unmodulated vertical interval.

In spectrum analyzer 10, IF amplifier 36 is fixed-tuned to the frequency of the picture carrier to provide triggers that allow measuring spectral energy centered in the channel being measured. However, other types of measurements, such as spectral analysis of the multiburst color test signal represented in channel three of FIG. 1, require different frequency offsets from the carrier frequency. Spectrum analyzer 10 cannot make such measurements because other signals, such as adjacent channel picture or sound carriers, may interfere with extracting a stable trigger signal.

What is needed, therefore, is an in-service radio-frequency signal measurement system capable of performing gated spectral measurements on signals, such as the multiburst color test signal, that are distributed at frequencies throughout the channel being measured. The system should also be useful for broadcast signal measurements such as those found in cellular radio applications.

SUMMARY OF THE INVENTION

An object of this invention is, therefore, to provide an apparatus and a method for making in-service gated spectral measurements of signals, such as a multiburst color test signal, that are distributed at frequencies throughout the channel being measured.

Another object of this invention is to provide a tunable trigger acquisition system that allows stable measurement of signals offset at predetermined frequencies from the picture carrier of the channel being measured.

A further object of this invention is to provide a tunable trigger acquisition system having a selectable bandwidth that provides gated spectral measurement capabilities for other than CATV signals, such as cellular radio, time-domain multiplexed signals.

The invention provides an improved spectrum analyzer having a tunable trigger acquisition system having a selectable trigger acquisition bandwidth. Sufficiently wide signal acquisition bandwidth is obtained by tapping into a high-frequency IF amplifier signal and down-converting it to a moderate IF frequency for trigger extraction. A down-conversion local oscillator is phase-locked-loop tunable over a range of the high IF frequencies to allow extracting a time and frequency selectable trigger from the desired carrier signal frequency even if the spectrum analyzer is tuned to a frequency substantially offset from the desired carrier. The moderate frequency IF amplifier includes a switchable bandpass filter that provides adequate selectivity to detect triggers from a variety of signal types while rejecting unwanted signals such as adjacent channel CATV carriers that are often detectable when the measurement frequency is offset toward the channel edges.

Additional objects and advantages of this invention will be apparent from the following detailed description of a preferred embodiment thereof that proceeds with reference to the accompanying drawings.

DETAILED DESCRIPTION OF PREFERRED EMBODIMENTS

Figure 2A:
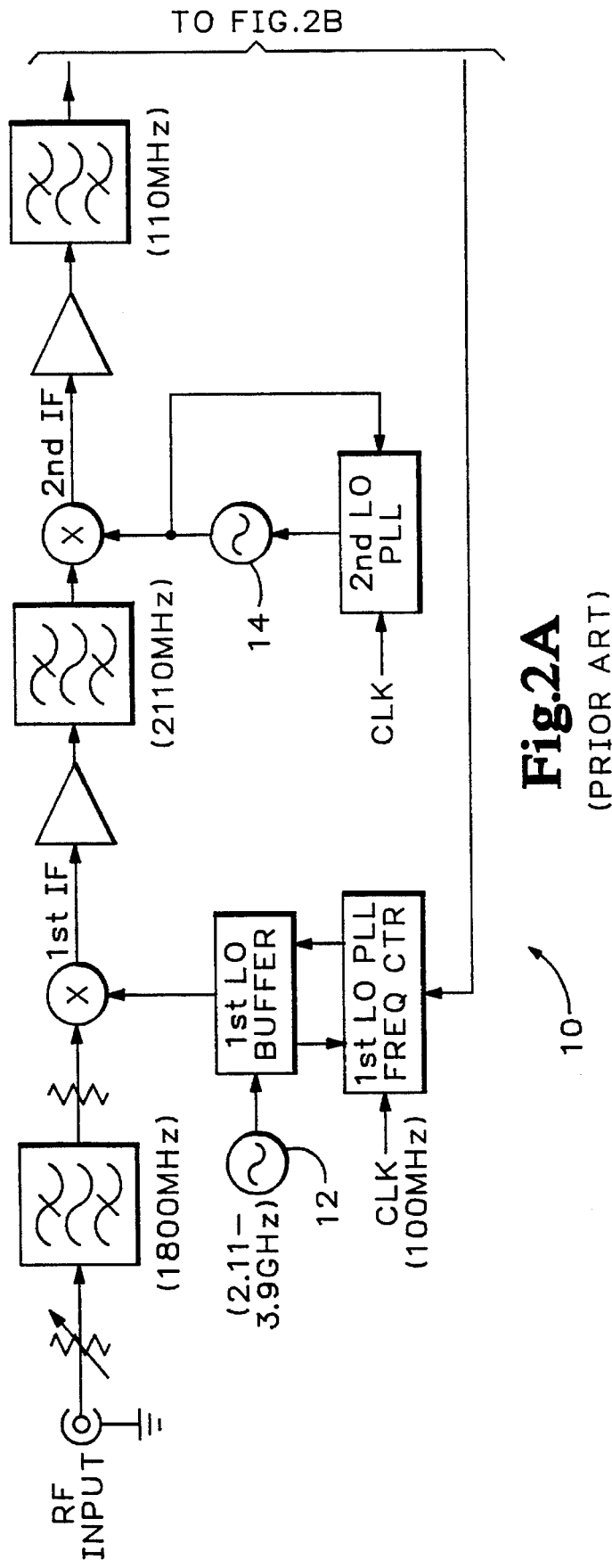
FIG. 2 is a simplified schematic block diagram showing a prior art spectrum analyzer adapted to provide carrier-to-noise ratio and triple-beat-ratio in-service CATV measurements.
Figure 2B:
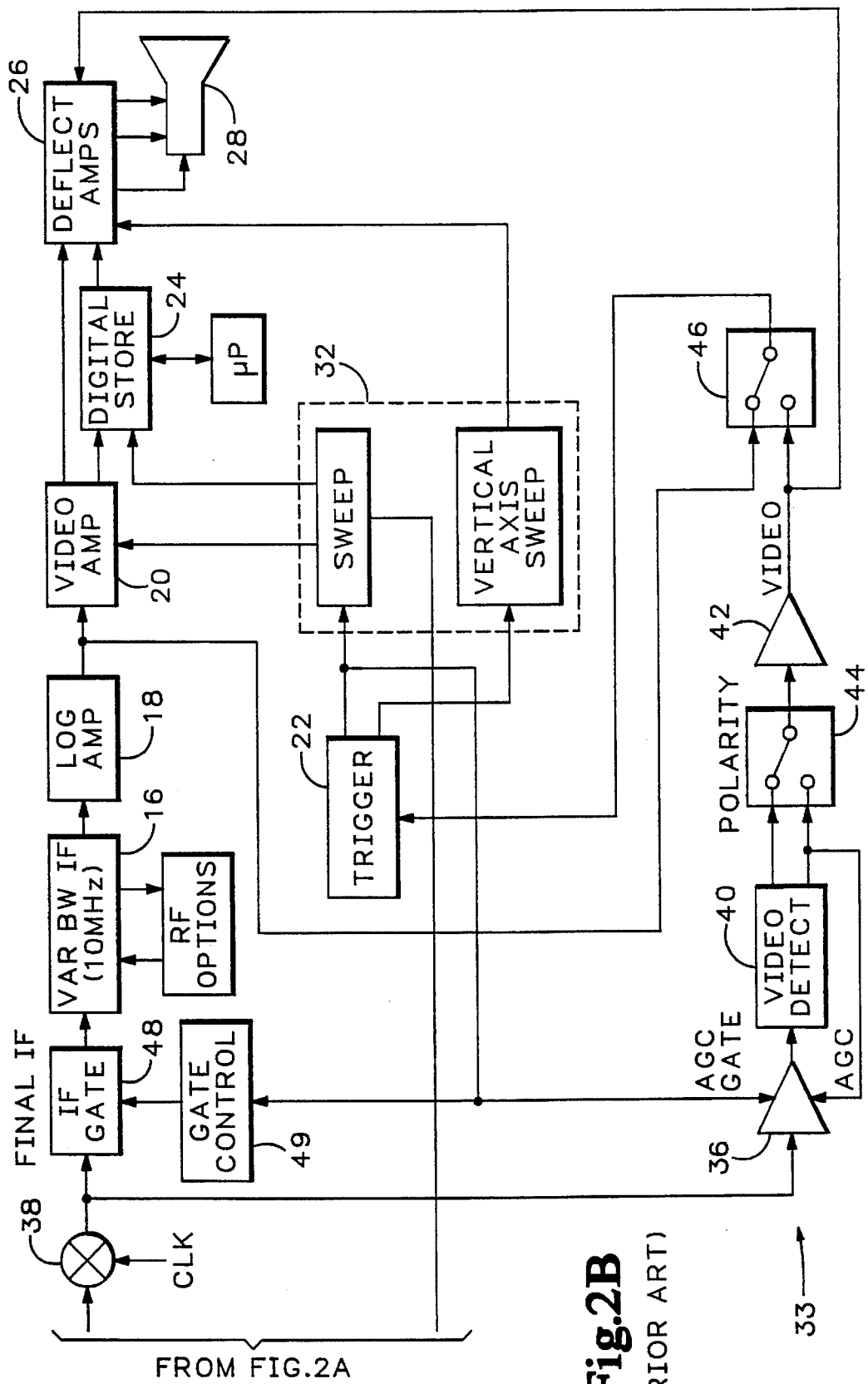
Figure 3A:
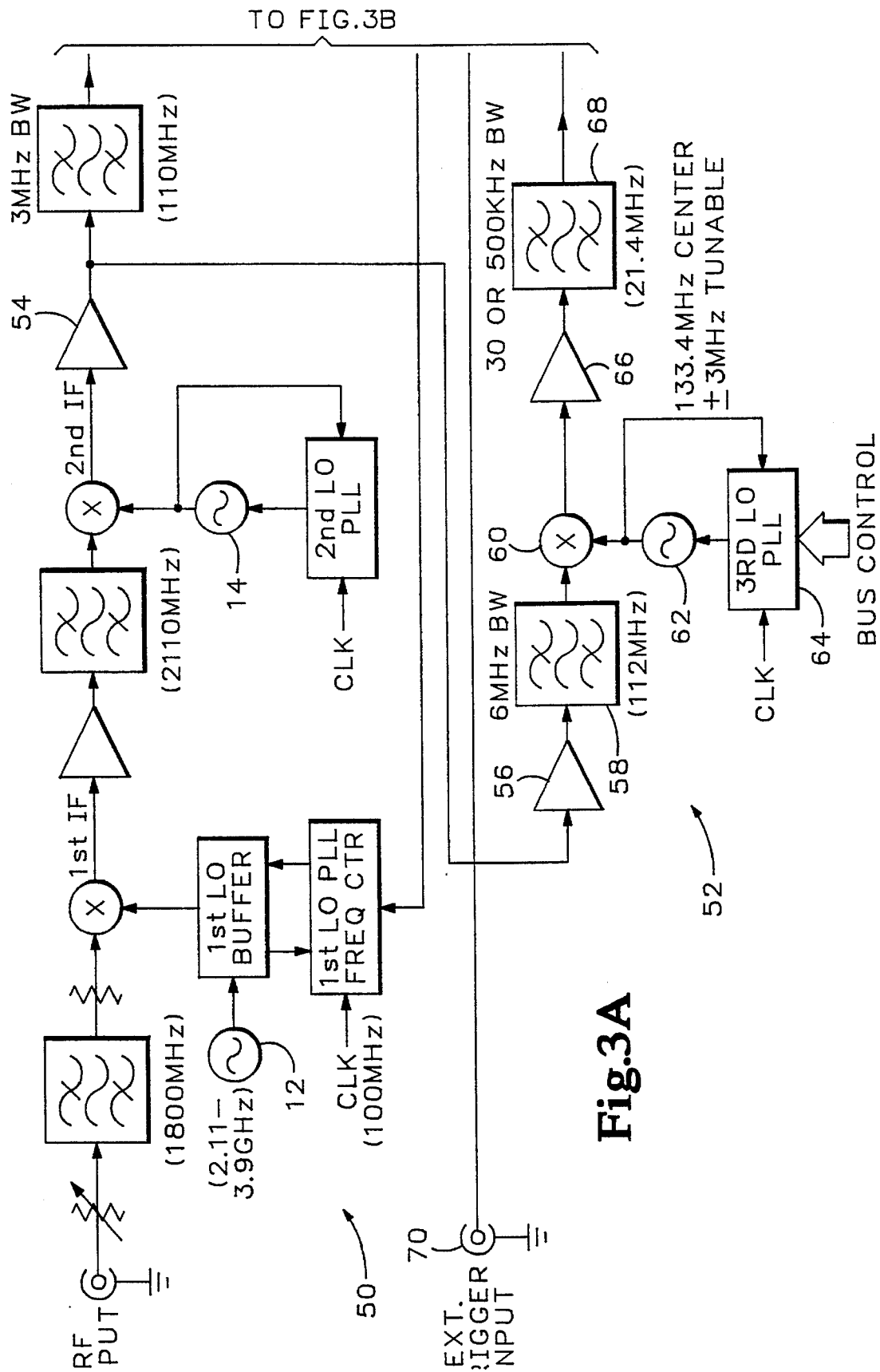
FIG. 3 is a simplified schematic block diagram showing a spectrum analyzer adapted to provide tunable trigger gated spectrum in-service CATV measurements in accordance with the invention.
Figure 3B:
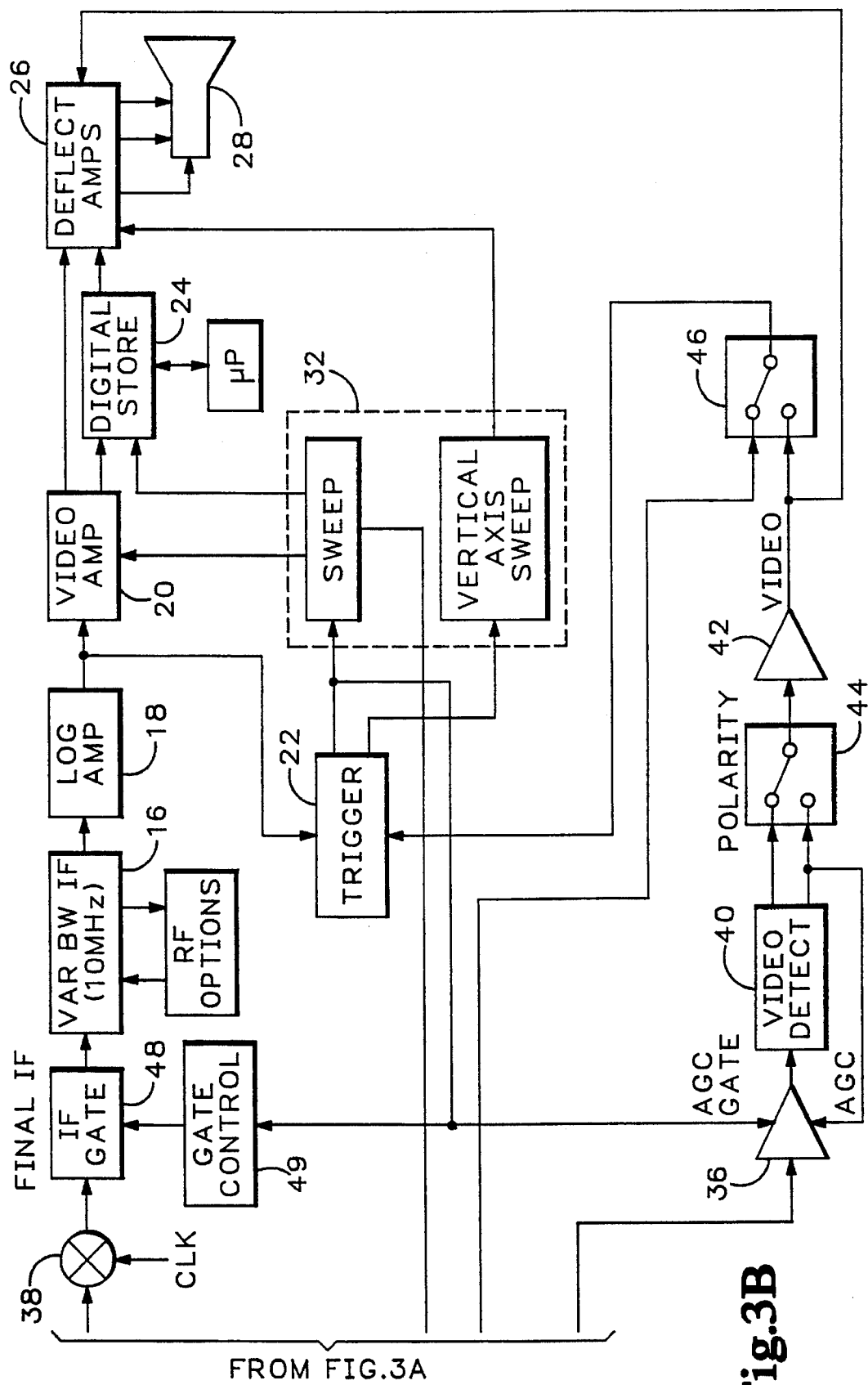

Referring to FIG. 3, an improved spectrum analyzer 50 is implemented by providing the below-described modifications to a prior art spectrum analyzer (FIG. 2) such as a Model 2714 manufactured by Tektronix, Inc., the assignee of this application. In spectrum analyzer 50, the RF input signal is conventionally attenuated, filtered, and mixed with swept local oscillator 12 to up-convert the frequency of the input signal to the first intermediate frequency. The first intermediate frequency is then down-converted by second fixed frequency local oscillator 14 to produce the second intermediate frequency. The second intermediate frequency is mixed with the system clock signal CLK, preferably 100 MHz, to produce the final intermediate frequency signal for processing and display.

The final intermediate frequency signal is conditioned by variable bandwidth IF amplifier 16 and logarithmic amplifier 18 for distribution to video amplifier 20 and trigger circuit 22. The output signal from video amplifier 20 is either stored in digital storage device 24 or sent to deflection amplifier 26 for displaying on cathode-ray tube (CRT) 28 or another suitable display device. The output signal from trigger circuit 22 is sent to sweep circuit 32 for triggering sweep signals that coordinate the first local oscillator tuning frequency with the video signal display. The displayed signal originates either in real time from video amplifier 20 or delayed from digital storage device 24.

As described above, transmission gate 48 is situated in the IF signal path to pass signal energy during predetermined measurement time periods. Transmission gate 48 is controlled by gate control circuit 49 that is coupled to the output of trigger circuit 22.

Figure 1:
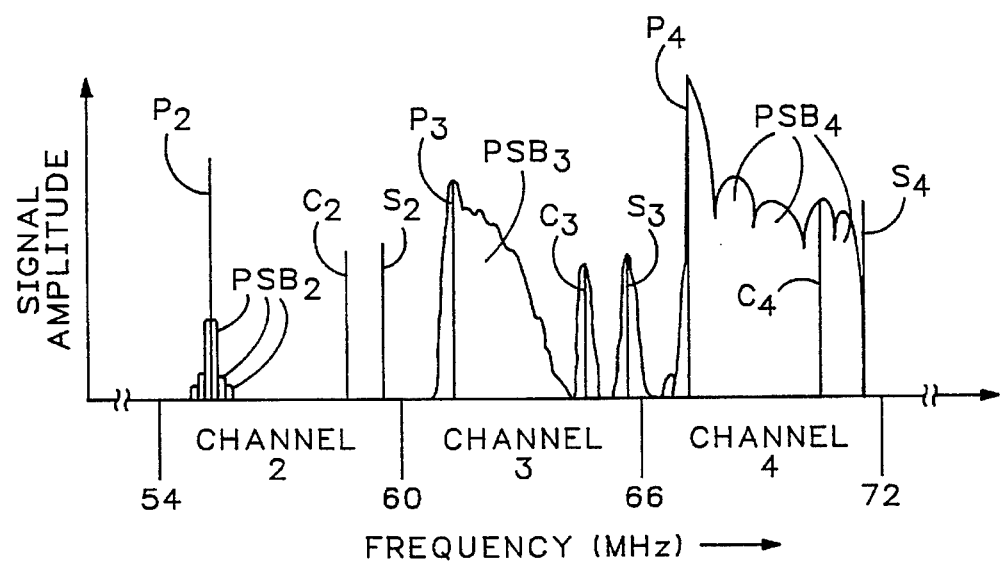
FIG. 1 is a frequency versus signal amplitude graph showing a typical spectral signal intensity distribution of three adjacent television channels.

A measurement, such as a spectral analysis of multiburst color test signal $PSB_4$ shown in channel four of FIG. 1, requires sampling energy at various frequencies within the channel being measured, thereby rendering the prior system unworkable because adjacent channel carriers such as $S_3$ may prevent extracting a stable trigger signal required for making the measurement.

Accordingly, spectrum analyzer 50 includes a tunable trigger acquisition system 52 rather than the fixed tuned trigger extraction circuit 33 of spectrum analyzer 10 (FIG. 2). Sufficiently wide signal acquisition bandwidth is obtained by extracting from the output of a high-frequency IF amplifier 54 a high-frequency IF amplifier signal, preferably 112 MHz, amplifying the signal with an IF amplifier 56, filtering the signal with a bandpass filter 58, and down-converting the signal in a mixer 60 to a moderate IF frequency, preferably 21.4 MHz, for trigger extraction. A down-conversion local oscillator 62 is tuned with a phase-locked-loop 64 over a preferred range of the high IF frequencies, spanning 130.4 MHz to 136.4 MHz, allowing extraction of a time and frequency selectable trigger from the desired carrier signal frequency even when spectrum analyzer 50 is tuned substantially away from the desired carrier. The signal from mixer 60 is amplified by an IF amplifier 66 and passed through a switchable bandpass filter 68 that provides adequate selectivity to detect triggers from a variety of signal types while rejecting unwanted signals such as adjacent channel CATV carriers that are often detectable when the measurement frequency is offset toward the channel edges.

Depending on the type of signal being measured, bandpass filter 68 must have a bandwidth sufficiently wide to pass accurate timing signal information but sufficiently narrow to reject unwanted carriers. For television measurements, a 3 dB bandwidth of about 500 KHz is preferred for passing synchronization pulses. For time-domain multiplexed RF signal measurements, such as those found in the respective U.S. and European cellular telephone systems, Time Domain Multiplex Access ("TDMA") and Groupe System Mobile ("GSM"), a 3 dB bandwidth of about 30 KHz is preferred.

TDMA and GSM cellular telephone systems have cellsite and handset channel frequency spacings of about 30 KHz with the cellsite and handset baseband frequencies offset by about 45 MHz. Each channel is identified by a digital code that can be extracted by tunable trigger acquisition system 52 for measurement of the spectral energy associated with a particular cellular channel.

The remainder of tunable trigger acquisition system 52 is similar to that described for spectrum analyzer 10. A notable addition is an external trigger input jack 70 that is selectable by trigger selector switch 46 to allow external synchronization signals to trigger particular types of measurements.

Skilled workers will recognize that portions of this invention may have alternate forms. For example, frequencies for the local oscillators, mixers, filters, and IF amplifiers may be other than those described and may be in different combinations suited to particular measurement applications. Phase-locked-loop tuning need not be employed. Bandpass filter 68 need not be switchable but may have a fixed or variable bandwidth. Likewise, tunable trigger acquisition system 52 can extract a signal from other than IF amplifier 54 and my take the form of an entirely independent receiver with a separate RF input. Finally, many useful measurements may be made without the need for an IF transmission gate.

It will be obvious to those having skill in the art that many changes may be made to the details of the above-described embodiment of this invention without departing from the underlying principles thereof. Accordingly, it will be appreciated that this invention is also applicable to radio-frequency measurement applications other than those found in cable television. The scope of the present invention should be determined, therefore, only by the following claims.

We claim:

1. In an apparatus for displaying a frequency spectrum associated with a carrier signal having first and second modulated time interval portions and first and second frequency spectrum portions, an improvement comprising:

a signal acquisition system having a measurement channel in which a first tunable frequency converter generates from the frequency spectrum associated with the carrier signal an intermediate frequency spectrum having an intermediate frequency signal;

a trigger acquisition system coupled to receive the intermediate frequency spectrum having a second tunable frequency converter and a detector for tuning to one of the frequency spectrum portions extracting a trigger signal from the intermediate frequency signal corresponding to the first modulated time interval portion; and display means responsive to the trigger signal and the second portion of the intermediate frequency spectrum for displaying a frequency spectrum measurement associated with the second modulated time interval portion of the second frequency spectrum portion.

2. The apparatus of claim 1 further including an IF transmission gate that transmits to the display means in response to the trigger signal the second modulated time interval portion of the second frequency spectrum portion of the intermediate frequency spectrum.

3. The apparatus of claim 1 in which the signal acquisition system and the trigger acquisition system share at least the first tunable frequency converter and a fixed frequency converter that generates from the frequency spectrum associated with the carrier signal the intermediate frequency spectrum.

4. The apparatus of claim 1 in which the second tunable frequency converter includes a phase locked loop for tuning the trigger acquisition system to a frequency within the intermediate frequency spectrum.

5. The apparatus of claim 1 in which the trigger acquisition system further includes a bandpass filter having a bandwidth sufficient to pass trigger-related carrier modulation but having a bandwidth insufficient to pass a signal associated with an adjacent carrier.

6. The apparatus of claim 5 in which the bandpass filter has a bandwidth of about 500 KHz.

7. The apparatus of claim 5 in which the bandpass filter has a bandwidth of about 30 KHz.

8. The apparatus of claim 1 in which a test signal modulates the carrier signal during the normally unmodulated time interval portion of the carrier signal and the display means displays a frequency spectrum resulting from modulating the carrier with the test signal.

9. The apparatus of claim 8 in which the test signal is a multiburst color test signal and the unmodulated time interval portion is a television vertical retrace time interval.

10. In a spectrum analyzer, a method for displaying a frequency spectrum measurement associated with a carrier signal that has first and second modulated time interval portions and first and second frequency spectrum portions, comprising the steps of:

acquiring the frequency spectrum associated with the carrier signal;

tuning a first frequency converter for converting the frequency spectrum associated with the carrier signal to an intermediate frequency spectrum having an intermediate frequency signal with the first frequency converter offset in frequency from the carrier signal;

tuning a second frequency conveyer to one of the frequency spectrum portions of the in the intermediate frequency spectrum containing the intermediate frequency signal;

extracting a trigger signal from the intermediate frequency signal of the tuned frequency spectrum portion during the first modulated time interval portion; and displaying in response to the trigger signal and the intermediate frequency spectrum a frequency spectrum measurement of the intermediate frequency spectrum associated with the second modulated time interval portion of the second frequency spectrum portion.

11. The method of claim 10 further including the step of gating in response to the trigger signal the second modulated time interval portion of the second frequency spectrum portion of the intermediate frequency spectrum.

12. The method of claim 10 further including the step of filtering signals in the trigger acquisition system such that trigger-related signals are detected and adjacent channel signals are rejected.

13. The method of claim 10 further including the steps of:

receiving a carrier modulated with a test signal during the normally unmodulated time interval portion; and displaying a frequency spectrum resulting from modulating the carrier with the test signal.

\* \* \* \* \*